(12) United States Patent
Kim et al.

(10) Patent No.: US 10,674,651 B2
(45) Date of Patent: Jun. 2, 2020

(54) PRINTED CIRCUIT BOARD INSPECTING APPARATUS, METHOD FOR DETERMINING FAULT TYPE OF SCREEN PRINTER AND COMPUTER READABLE RECORDING MEDIUM

(71) Applicant: KOH YOUNG TECHNOLOGY INC., Seoul (KR)

(72) Inventors: Jae Hyung Kim, Seongnam-si (KR); Jeong Kyu Noh, Seoul (KR); Jae Hwan Lee, Seoul (KR); Duk Young Lee, Suwon-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 206 days.

(21) Appl. No.: 15/852,646

(22) Filed: Dec. 22, 2017

(65) Prior Publication Data

US 2019/0200494 A1 Jun. 27, 2019

(30) Foreign Application Priority Data

Dec. 21, 2017 (KR) ........................ 10-2017-0177379

(51) Int. Cl.
*G06K 9/00* (2006.01)
*H05K 13/08* (2006.01)
(Continued)

(52) U.S. Cl.
CPC ............. *H05K 13/08* (2013.01); *B41F 15/26* (2013.01); *B41F 33/0036* (2013.01);
(Continued)

(58) Field of Classification Search
CPC .... H05K 13/08; H05K 3/1216; H05K 3/3484; G01B 11/25; G01N 21/956;
(Continued)

(56) References Cited

U.S. PATENT DOCUMENTS 5,982,927 A * 11/1999 Koljonen ............. B23K 3/0638
382/168
6,317,513 B2 * 11/2001 Michael ................... B23K 3/08
382/145
(Continued)

FOREIGN PATENT DOCUMENTS

WO 2012/164233 12/2012

OTHER PUBLICATIONS

Korean Office Action with English translation from Korean Intellectual Property Office, corresponding to Application No. 10-2017-0177379, dated Mar. 25, 2019.
(Continued)

*Primary Examiner* — Aaron W Carter
(74) *Attorney, Agent, or Firm* — Kile Park Reed & Houtteman PLLC

(57) ABSTRACT

A printed circuit board inspection apparatus generates at least one image indicating whether an anomaly associated with a plurality of solder pastes printed on a first printed circuit board is detected, if an anomaly in at least one solder paste of the plurality of solder pastes is detected by using an image of the first printed circuit board, obtains at least one value indicating relevance between at least one fault type and the generated at least one image, using the machine-learning based model, and determines a fault type associated with the at least one solder paste in which the anomaly is detected from at least one fault type, based on the obtained at least one value.

19 Claims, 11 Drawing Sheets

(51) Int. Cl.
| | |
|---|---|
| *B41F 33/00* | (2006.01) |
| *G06T 7/00* | (2017.01) |
| *B41F 15/26* | (2006.01) |
| *G01B 11/25* | (2006.01) |
| *G01N 21/956* | (2006.01) |
| *G06K 9/20* | (2006.01) |
| *H05K 3/12* | (2006.01) |
| *H05K 3/34* | (2006.01) |

(52) U.S. Cl.
CPC ......... *B41F 33/0045* (2013.01); *G01B 11/25* (2013.01); *G01N 21/956* (2013.01); *G06K 9/20* (2013.01); *G06T 7/001* (2013.01); *G01N 2021/95646* (2013.01); *G06T 2207/20081* (2013.01); *G06T 2207/20084* (2013.01); *H05K 3/1216* (2013.01); *H05K 3/3484* (2013.01)

(58) Field of Classification Search
CPC ............ G01N 2021/95646; G06K 9/20; G06T 2207/20081; G06T 2207/20084; G06T 7/001; G41F 33/0036; G41F 33/0045; B41F 15/26

See application file for complete search history.

(56) References Cited

U.S. PATENT DOCUMENTS

| | | | | | |
|---|---|---|---|---|---|
| 6,336,082 | B1* | 1/2002 | Nguyen | ............... | G06K 9/6255 340/658 |
| 6,567,542 | B1* | 5/2003 | Koljonen | ............... | G06T 7/0006 382/147 |
| 6,574,358 | B1* | 6/2003 | Koljonen | ............... | G06T 7/0004 382/147 |
| 6,738,505 | B1* | 5/2004 | Prince | ..................... | B23K 3/08 382/150 |
| 2002/0057830 | A1* | 5/2002 | Akin | .................... | G01R 31/309 382/147 |
| 2002/0081025 | A1* | 6/2002 | Wagman | ............... | G06T 1/0007 382/170 |
| 2002/0083570 | A1* | 7/2002 | Inoue | ................. | H05K 13/0465 29/428 |
| 2002/0168097 | A1* | 11/2002 | Neubauer | ............ | G06K 9/3241 382/145 |
| 2002/0168099 | A1* | 11/2002 | Noy | ................. | G01N 21/95607 382/149 |
| 2004/0218808 | A1* | 11/2004 | Prince | ..................... | B23K 3/08 382/150 |
| 2004/0254752 | A1* | 12/2004 | Wisniewski | ............ | H01L 22/20 702/84 |
| 2006/0000872 | A1* | 1/2006 | Nakagawa | ......... | H05K 13/0817 228/56.5 |
| 2006/0153439 | A1* | 7/2006 | Moriya | ............ | G01N 21/95684 382/147 |
| 2008/0083816 | A1* | 4/2008 | Leinbach | ............. | B23K 3/0638 228/102 |
| 2008/0092095 | A1* | 4/2008 | Lanzerotti | ............... | H01L 22/20 702/185 |
| 2009/0161943 | A1* | 6/2009 | Yamashita | ......... | G01N 21/9501 382/149 |
| 2010/0143656 | A1* | 6/2010 | Zu | ........................ | B23K 3/0638 428/172 |
| 2013/0089239 | A1* | 4/2013 | Ikeda | ................. | G01B 11/0608 382/106 |
| 2014/0210993 | A1* | 7/2014 | Butler | ...................... | G06T 3/00 348/87 |
| 2015/0045927 | A1* | 2/2015 | Haugen | .................... | H05K 3/00 700/109 |
| 2015/0050418 | A1* | 2/2015 | Greer | .................... | B23K 1/0016 427/9 |
| 2015/0210064 | A1* | 7/2015 | Kim | ....................... | B41F 33/00 101/129 |
| 2016/0203592 | A1* | 7/2016 | Amano | ................ | G01B 11/002 348/87 |
| 2017/0273228 | A1* | 9/2017 | Lim | ........................ | H05K 13/08 |
| 2018/0049356 | A1* | 2/2018 | Mori | .................... | B23K 1/0016 |
| 2018/0157933 | A1* | 6/2018 | Brauer | .................. | G06T 7/0008 |
| 2019/0005357 | A1* | 1/2019 | Bhaviripudi | ......... | G06K 9/6267 |
| 2019/0073568 | A1* | 3/2019 | He | ........................ | G06K 9/6267 |
| 2019/0114764 | A1* | 4/2019 | Okuda | ................ | G01N 21/956 |
| 2019/0187555 | A1* | 6/2019 | Lin | ........................ | G03F 1/84 |
| 2019/0195939 | A1* | 6/2019 | Noh | ....................... | B41F 15/26 |
| 2019/0200494 | A1* | 6/2019 | Kim | ....................... | G01B 11/25 |
| 2019/0269017 | A1* | 8/2019 | Lee | ....................... | H05K 3/1216 |
| 2019/0286983 | A1* | 9/2019 | Jung | ....................... | H01L 22/12 |
| 2019/0318471 | A1* | 10/2019 | Chen | ....................... | G06T 7/001 |

OTHER PUBLICATIONS

Young-Gyu Kim, et al., "Defect Classification of SMD Defect Based on Deep Learning", the Korean Institute of Electrical Engineers CICS 17 information and control conference, the Korean Institute of Electrical Engineers, Oct. 2017, pp. 15-16.

Chang Hyun Park, et al., "Automated Inspection for Paper Cups Using Deep Learning", Journal of the Korean Society for Precision Engineering., Jul. 2017, vol. 34, No. 7, pp. 449-453.

Extended European Search Report for European Application No. 17210436.6, dated Sep. 3, 2018.

Madhav Moganti et al.,; "A Subpattern Level Inspection System for Printed Circuit Boards"; Computer Vision and Image Understanding, vol. 70., No. 1., Apr. 1998; pp. 51-62.

Hilario Haruomi Kobayashi et al.; "Hybrid Defect Detection Method Based on the Shape Measurement and Feature Extraction for Complex Patterns"; IEICE Transactions on Information and Systems., vol E83-D, No. 7, Jul. 2000; pp. 1338-1345.

Korean Office Action with English translation for Korean Application No. 10-2017-0177379, dated Sep. 16, 2019.

Csaba Benedek et al, "Solder Paste Scooping Detection by Multi-level Visual Inspection of Printed Circuit Boards", IEEE Transactions on Industrial Electronics, vol. 60, No. 6, Jun. 2013, pp. 2318-2331.

Korean Office Action, with English translation, corresponding to Korean Application No. 10-2019-0177812, dated Feb. 14, 2020.

* cited by examiner

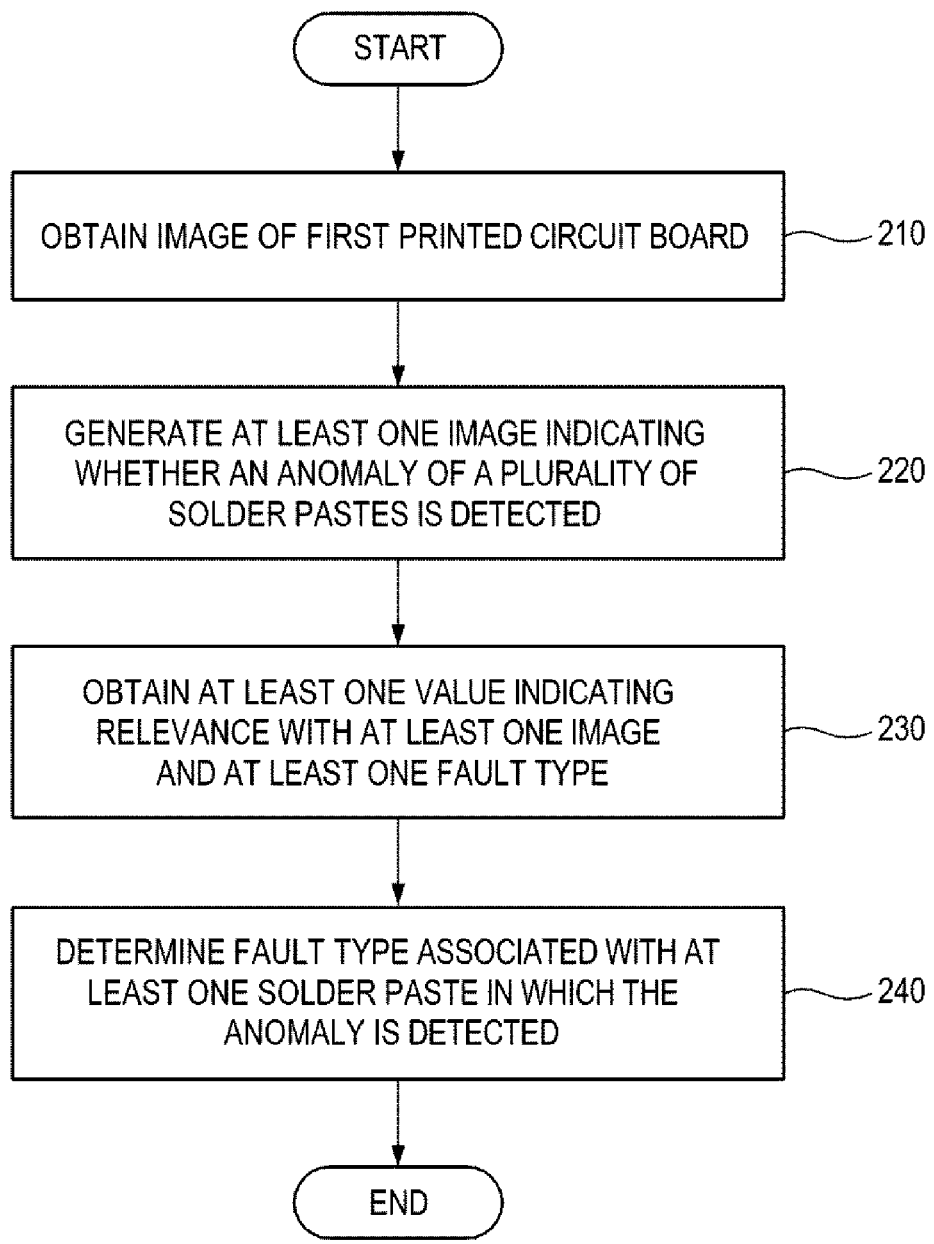

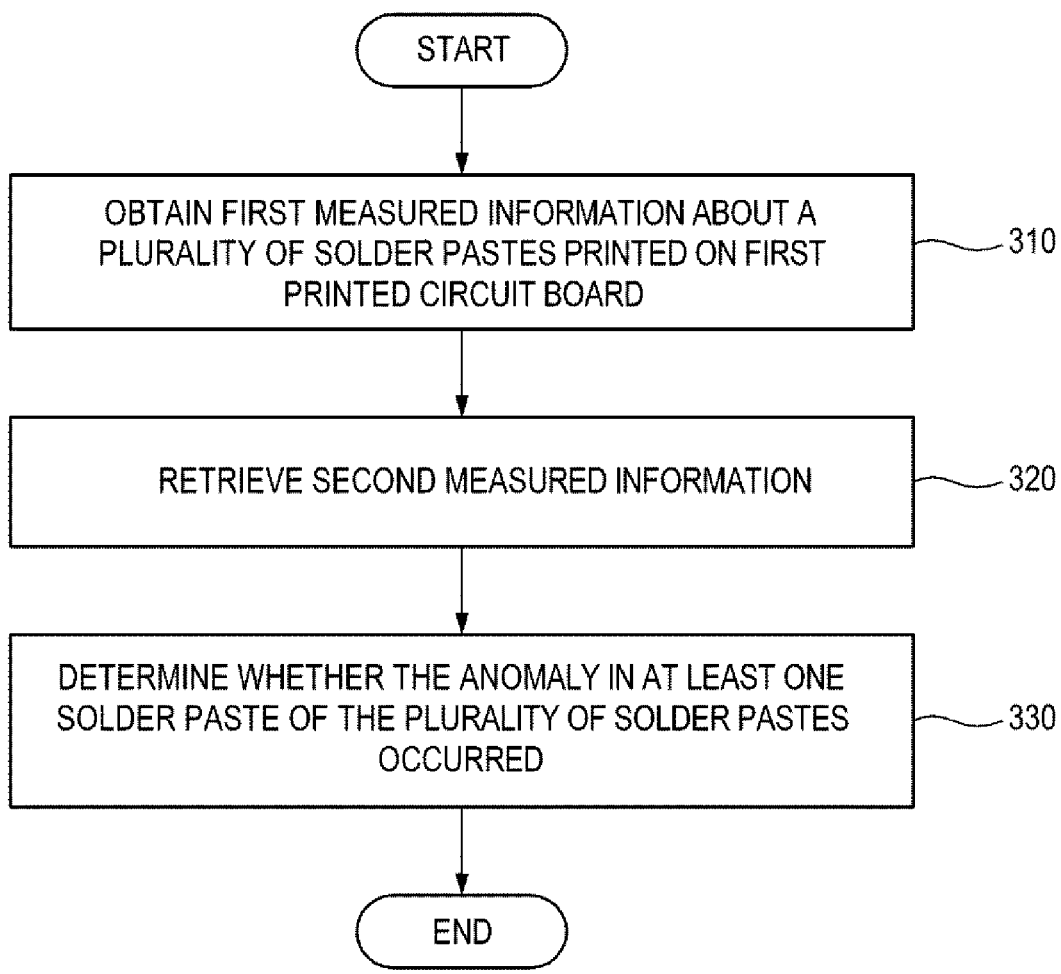

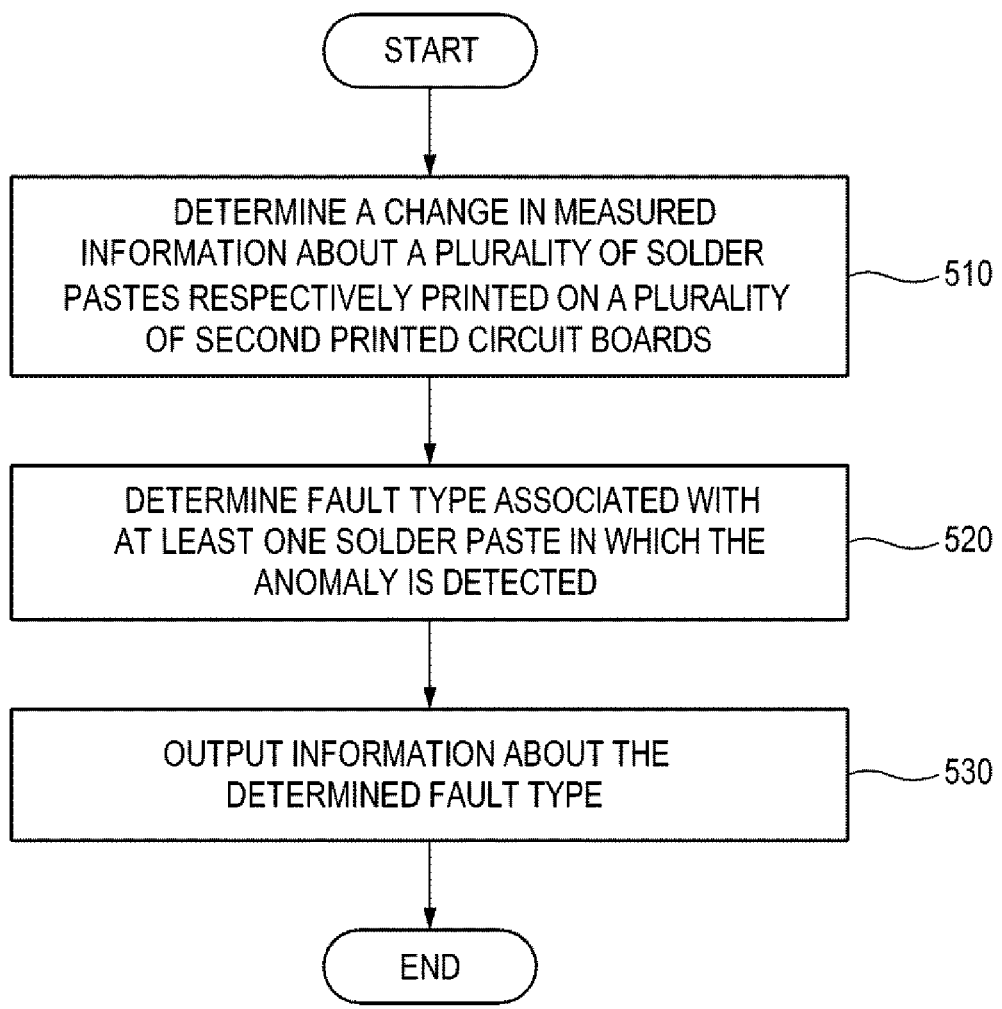

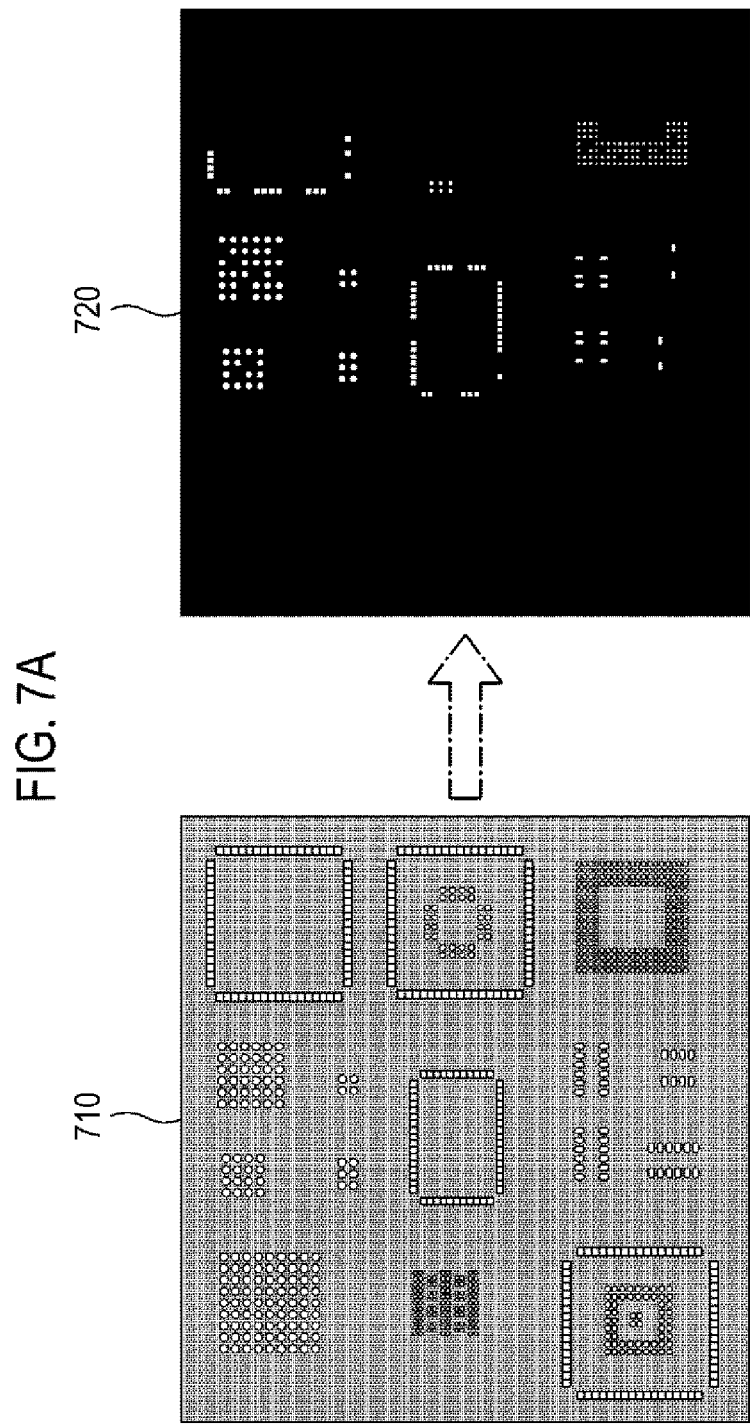

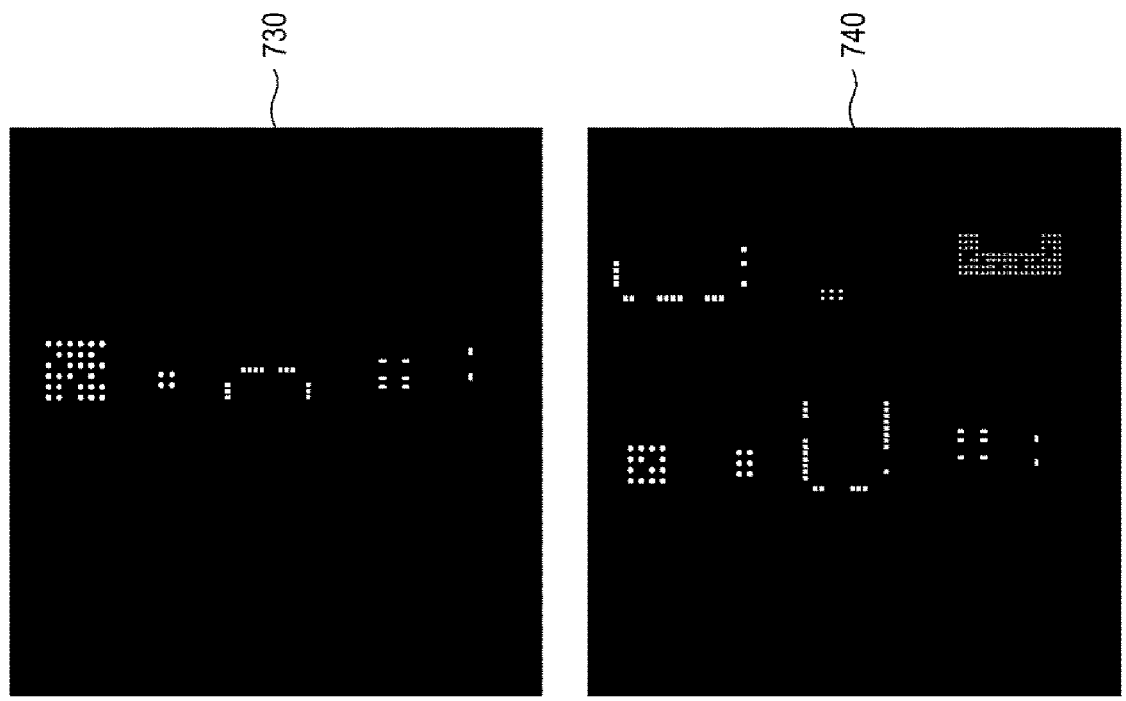
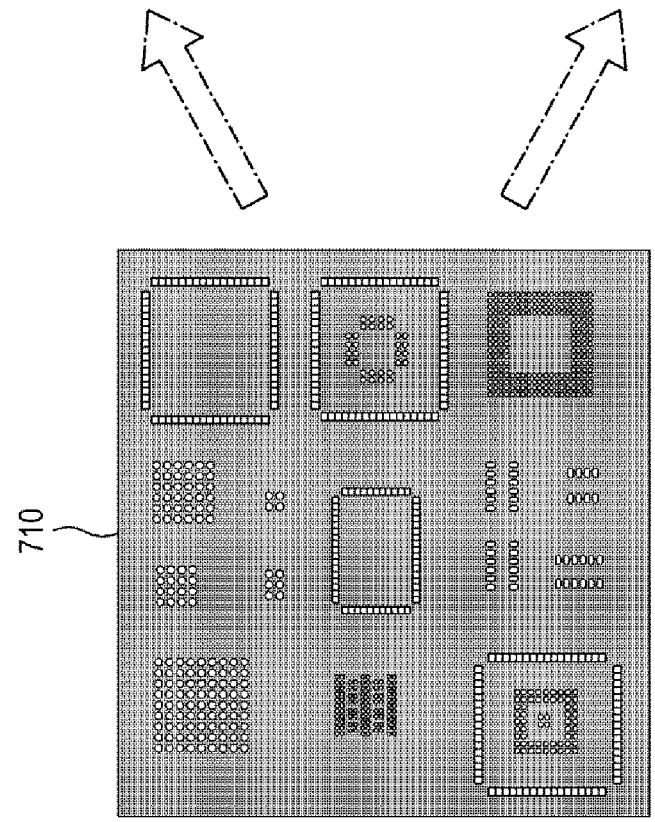
FIG. 7B

PRINTED CIRCUIT BOARD INSPECTING APPARATUS, METHOD FOR DETERMINING FAULT TYPE OF SCREEN PRINTER AND COMPUTER READABLE RECORDING MEDIUM

TECHNICAL FIELD

The present disclosure relates to a printed circuit board inspection apparatus and, more particularly, to a printed circuit board inspection apparatus for determining a fault type in a screen printer used for printing a printed circuit board.

The present disclosure is derived from a research carried out as part of the Robot industry convergence core technology of the Ministry of Trade, Industry and Energy [Project No.: 10077589, Project title: Development of SMT optimization system based on machine learning].

BACKGROUND ART

Solder paste is printed on a printed circuit board that is mounted on an electronic device by a screen printer and the process of printing solder paste on a printed circuit board using a screen printer is as follows. A screen printer loads a printed circuit board on a table for fixing the printed circuit board and aligns a stencil on the printed circuit board with the apertures of the stencil on the pad of the printed circuit board. Thereafter, the screen printer prints the solder paste onto the printed circuit board by depositing the solder paste through the apertures of the stencil using a squeegee. The screen printer then separates the stencil and the printed circuit board from each other.

The shape of solder pastes printed on a printed circuit board may be inspected through SPI (Solder Paste Inspection). SPI is a technique that obtains a 2D or 3D image of the solder pastes printed on the printed circuit board through an optical technology and inspects the shape of solder pastes printed on the printed circuit board from the obtained image.

SUMMARY

The present disclosure provides a printed circuit board inspection apparatus that may determine, through the use of a machine-learning based model, fault type of a screen printer associated with an anomaly in a solder paste.

The present disclosure provides a computer-readable recording medium having a program including executable instructions for enabling a printed circuit board inspection apparatus to determine, through the use of a machine-learning based model, fault type of a screen printer related to an anomaly in a solder paste.

The present disclosure provides a method for determining a fault type of a screen printer related to an anomaly in a solder paste using a machine-learning based model in a printed circuit board inspection apparatus.

An embodiment of the present disclosure provides a printed circuit board inspection apparatus that includes a memory configured to store a machine-learning based model that derives at least one value indicating relevance between at least one fault type of a screen printer and an image indicating whether an anomaly associated with a plurality of solder pastes printed on a printed circuit board is detected and a processor electrically connected with the memory. The processor is configured to generate at least one image indicating whether an anomaly associated a plurality of solder pastes printed on a first printed circuit board is detected, if an anomaly in at least one solder paste of the plurality of solder pastes is detected by using an image of the first printed circuit board, obtain at least one value indicating relevance between at least one fault type and the generated at least one image, using the machine-learning based model, and determine a fault type associated with the at least one solder paste in which the anomaly is detected from at least one fault type, based on the obtained at least one value.

In an embodiment, the processor detects whether the anomaly in at least one solder paste of the plurality of solder pastes occurred using first measured information about the plurality of solder pastes obtained from the image of the first printed circuit board.

In an embodiment, the first measured information includes at least one of a volume, an area, a height, a shape, or a position of a solder paste.

In an embodiment, the memory further stores second measured information about a plurality of solder pastes respectively printed on a plurality of second printed circuit boards that have been inspected by the apparatus before the first printed circuit board is inspected, and the processor detects whether the anomaly in at least one solder paste of the plurality of solder pastes occurred by using the first measured information and the second measured information.

In an embodiment, the second measured information is generated by combining sequentially the measured information about the plurality of solder pastes respectively printed on the plurality of second printed circuit boards in accordance with an inspection sequence of the plurality of second printed circuit boards.

In an embodiment, the processor determines changes in the measured information about the plurality of solder pastes respectively printed on the plurality of second printed circuit boards according to the inspection sequence of the plurality of second printed circuit boards on the basis of the second measured information, and determines the fault type associated with at least one solder paste in which the anomaly is detected from at least one fault type based on the determined changes in the measured information.

In an embodiment, the at least one fault type includes a fault of a squeegee blade, a fault in fixing of the squeegee blade, a fault of a support part, a fault of a table, a fault due to poor setting of a grid lock, a fault due to negligence and poor kneading of a solder paste, a fault due to a deficit of a solder paste, and a fault due to poor contact of a stencil.

In an embodiment, the machine-learning based model is a CNN (Convolution Neural Network) model.

In an embodiment, the processor performs learning on the machine-learning based model through a plurality of images indicating whether an anomaly associated with a plurality of solder pastes printed on a printed circuit board is detected, classified in accordance with at least one fault type.

In an embodiment, the processor performs learning on the machine-learning based model through the generated at least one image, after the fault type associated with the at least one solder paste in which the anomaly is detected is determined.

In an embodiment, the processor determines a fault type corresponding to value over a predetermined threshold of the at least one obtained value as the fault type associated with the at least one solder paste in which the anomaly is detected.

An embodiment of the present disclosure provides a non-transitory computer-readable recording medium having a program to be executed by a computer, wherein the program includes executable instructions that instruct a processor, when the program is executed by the processor, to perform generating at least one images indicating whether an anomaly associated with a plurality of solder pastes printed on a first printed circuit board is detected, if an anomaly in at least one solder paste of the plurality of solder pastes is detected by using an image of the first printed circuit board, obtaining at least one value indicating relevance between at least one fault type and the generated at least one image, using a machine-learning based model that derives at least one value indicating relevance between at least one fault type of the screen printer and an image indicating whether an anomaly in a plurality of solder pastes printed on a printed circuit board is detected and determining a fault type associated with the at least one solder paste in which the anomaly is detected from at least one fault type, based on the obtained at least one value.

In an embodiment, the executable instructions further instruct the processor to perform detecting whether the anomaly in at least one solder paste of the plurality of solder pastes occurred, using first measured information about the plurality of solder pastes obtained from the image of the first printed circuit board.

In an embodiment, the first measured information includes at least one of a volume, an area, a height, a shape, or a position of a solder paste.

In an embodiment, the detecting whether the anomaly in at least one solder paste of the plurality of solder pastes occurred includes detecting whether the anomaly in at least one solder paste of the plurality of solder pastes occurred by using the first measured information and second measured information, wherein the second measured information is generated by combining sequentially the measured information about a plurality of solder pastes respectively printed on a plurality of second printed circuit board in accordance with inspection sequence of the plurality of second printed circuit boards that have been inspected by a printed circuit board inspection apparatus before the first printed circuit board is inspected.

In an embodiment, the machine-learning based model is a CNN (Convolution Neural Network) model.

In an embodiment, the executable instructions further instruct the processor to perform learning on the machine-learning based model through a plurality of images indicating whether an anomaly in a plurality of solder pastes printed on a printed circuit board is detected, classified in accordance with at least one fault type.

In an embodiment, the determining fault type includes determining a fault type corresponding to value over a predetermined threshold of the obtained at least one value as the fault types associated with the at least one solder paste in which the anomaly is detected.

An embodiment of the present disclosure provides a method for determining a fault type of a screen printer by a printed circuit board inspection apparatus, the method includes: generating at least one images indicating whether an anomaly associated with a plurality of solder pastes printed on a first printed circuit board is detected, if an anomaly in at least one solder paste of the plurality of solder pastes is detected by using an image of the first printed circuit board, obtaining at least one value indicating relevance between at least one fault type and the generated at least one image, using a machine-learning based model that derives at least one value indicating relevance between at least one fault type of the screen printer and an image indicating whether an anomaly associated with a plurality of solder pastes printed on a printed circuit board is detected and determining fault type associated with the at least one solder paste in which the anomaly is detected from at least one fault type, based on the obtained at least one value.

A printed circuit board inspection apparatus according to various embodiments of the present disclosure may detect a fault type associated with the at least one solder paste in which an anomaly is detected from at least one fault type of a screen printer, using at least one image indicating whether an anomaly associated with a plurality of solder pastes printed on a first printed circuit board is detected. Accordingly, it is possible to quickly determine a fault type of the screen printer that causes an anomaly and make appropriate corrections.

BRIEF DESCRIPTION OF THE DRAWINGS

The above and other aspects, features and advantages of the present disclosure will be more apparent from the following detailed description taken in conjunction with the accompanying drawings, in which:

FIG. 2 is a flowchart of a method of determining a fault type associated with at least one solder paste in which an anomaly is detected according to various embodiments of the present disclosure;

FIG. 3 is a flowchart of a method of detecting an anomaly in at least one solder paste printed on a printed circuit board, according to various embodiments of the present disclosure;

FIG. 5 is a flowchart of a method of determining a fault type of a screen printer that are associated with at least one solder paste in which an anomaly is detected, according to various embodiments of the present disclosure;

FIGS. 7A and 7B illustrate images indicating whether an anomaly in a plurality of solder pastes printed on a printed circuit board is detected according to various embodiments of the present disclosure.

DETAILED DESCRIPTION

Figure 1:
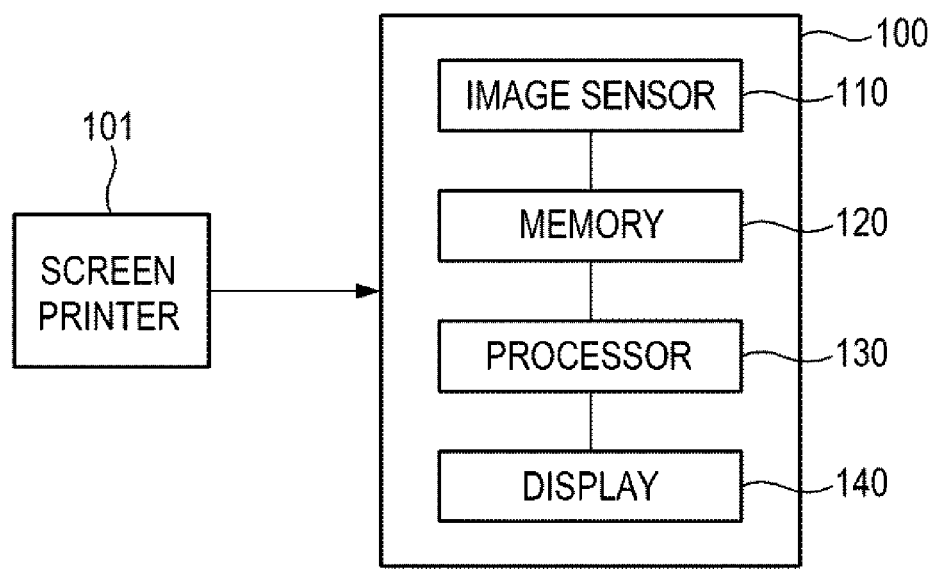
FIG. 1 is a block diagram of a printed circuit board inspection apparatus according to various embodiments of the present disclosure.

Embodiments described herein are provided as examples for explaining the spirit of the present disclosure. The scope of the present disclosure is not limited to the following embodiments or the detailed description of the embodiments.

In the following description, unless otherwise defined, all terms including technical and scientific terms used herein have the same meaning as commonly understood by those skilled in the art to which this disclosure belongs. All terms used herein are selected not to limit the scope of the present disclosure, but to make the present disclosure clearer.

The terms "comprise", "include", "have", etc. used herein should be understood as open-ended terms implying the possibility of including other embodiments, unless stated otherwise in phrases and sentences including the terms.

The singular forms "a," "an" and "the" are intended to include the plural forms as well, unless the context clearly indicates otherwise, and which will be applied in the same way to those in claims.

Terms such as 'first', 'second', etc. are used only for the purpose of distinguishing a plurality of constitutive elements from other constitutive elements, rather than to limit the order or priority of the constitutive elements.

The expressions 'based on' and 'on the basis of' used herein are used to describe one or more factors influencing decisions, determinations, or operations stated in phrases or sentences including the expressions, without excluding additional factors influencing such decisions, determinations, or operations.

It will be understood that when an element is referred to as being "coupled" or "connected" to another element in the present disclosure, it may be directly coupled or connected to the other element, or intervening elements may be present therebetween.

Hereafter, embodiments of the present disclosure are described with reference to the accompanying drawings. The same or corresponding components are given the same reference numerals in the accompanying drawings. Further, repeated description of the same or corresponding components may be omitted in the following description of embodiments. However, omission of a description of components is not intended to mean exclusion of the components from the embodiments.

FIG. 1 is a block diagram of a printed circuit board inspection apparatus according to various embodiments of the present disclosure.

According to an embodiment of the present disclosure, a printed circuit board inspection apparatus 100 may include an image sensor 110, a memory 120, and a processor 130. Further, the printed circuit board inspection apparatus 100 may further include a display 140 for outputting a result processed by the processor 130 and another output device (not shown) or a communication circuit (not shown) for transmitting the processed result to another electronic device. The image sensor 110, memory 120, processor 130, and display 140 are electrically connected to each other, so they may transmit/receive signals.

In an embodiment, the image sensor 110 may obtain an image of a printed circuit board printed with a plurality of solder pastes by a screen printer 101. The image obtained by the image sensor 110 may be a 2D or 3D image of the printed circuit board. The image of the printed circuit board obtained by the image sensor 110 may be used to measure information about the solder pastes printed on the printed circuit board. For example, information including at least one of the volume, area, height, shape, and position of the solder pastes printed on the printed circuit board may be measured using the image of the printed circuit board. However, these examples are provided just for explanation and the information is not limited thereto, and various information that indicates the characteristics of the solder pastes may be measured from the image of the printed circuit board. In the following description, 'measured information' may be defined as information about a plurality of pastes measured from an image of a printed circuit board.

In an embodiment, the memory 120 may store a machine-learning based model. The machine-learning based model may be learned to derive at least one value indicating relevance between at least one fault type of the screen printer 101 and an image indicating whether an anomaly in a plurality of solder pastes printed on a printed circuit board is detected. The machine-learning based model, for example, may be a CNN (Convolution Neutral Network) model. Further, the machine-learning based model may be stored in a memory of an electronic apparatus (ex, external server, etc.) connected to the printed circuit board inspection apparatus 100. In this case, the printed circuit board inspection apparatus 100 may communicate information for determining the fault type associated with the at least one solder paste in which the anomaly is detected with the electronic apparatus connected to the printed circuit board inspection apparatus 100.

In an embodiment, the at least one value indicating relevance between the at least one fault type and the image indicating whether an anomaly in a plurality of solder pastes printed on a printed circuit board is detected may be probability value. For example, the at least one value may indicates that the image indicating whether an anomaly in a plurality of solder pastes printed on a printed circuit board is detected may have relevance of a % with a first fault type of the screen printer 101 and relevance of b % with a second fault type of the screen printer 101. However, this example is provided only for explanation and the present disclosure is not limited thereto, and various values that may indicate relevance may be used.

In an embodiment, at least one fault type of the screen printer 101 may be at least one fault type that may cause a fault in a solder paste printed on a printed circuit board, of various fault types that may occur in the screen printer 101. For example, the at least one fault type of the screen printer 101 may include at least one of a fault of a squeegee blade of the screen printer 101, a fault in fixing of the squeegee blade (for example, a fault in fixing of a screw for fixing the squeegee blade), a fault of a support of the screen printer 101, a fault of a table of the screen printer 101, a fault due to poor setting of a grid lock when the grid lock is used as the support, a fault due to the state of a solder paste fed in the screen printer 101, for example, negligence of the solder paste and poor kneading of the solder paste, a fault due to a deficit of a solder paste fed in the screen printer 101, and a fault due to poor contact of a stencil.

However, these are provided just for explanation and the present disclosure is not limited thereto, and various fault types that may cause problems in a solder paste printed on a printed circuit board in the screen printer 101 may be included in the at least one fault type of the screen printer 101.

In an embodiment, the machine-learning based model stored in the memory 120 may be learned from a plurality of images indicating whether an anomaly in a plurality of solder pastes printed on a printed circuit board is detected, classified in accordance with the at least one fault type of the screen printer 101. For example, the machine-learning based model may be learned from a plurality of first images indicating whether an anomaly in a plurality of solder pastes printed on a printed circuit board is detected, classified into a first fault type of the screen printer 101 and a plurality of second images indicating whether an anomaly in a plurality of solder pastes printed on a printed circuit board is detected, classified into a second fault type of the screen printer 101. When an image indicating whether an anomaly in a plurality of solder pastes printed on a printed circuit board is detected is input, the machine-learning based model may output a value indicating the relevance between the input image and at least one of the first fault type and second fault type. A detailed learning method of the machine-learning based model will be described below.

In an embodiment, the processor 130 may detect whether an anomaly in at least one solder paste of the plurality of solder pastes printed on a first printed circuit board occurred, using an image of the first printed circuit board obtained by the image sensor 110. The first printed circuit board may be a printed circuit board that is printed with a plurality of solder pastes by the screen printer 101 and is then conveyed to the printed circuit board inspection apparatus 100 as an object to be inspected. For example, the processor 130 may generate first measured information about the plurality of solder pastes using the image of the first printed circuit board. The processor 130 may detect whether an anomaly in the at least one solder paste of the plurality of solder pastes occurred using the generated first measured information.

In an embodiment, the memory 120 may store second measured information about a plurality of solder pastes respectively printed on a plurality of second printed circuit boards that have been inspected before the first printed circuit board is inspected. The processor 130 may store second measured information generated in the process of inspecting the plurality of second printed circuit boards in the memory 120. For example, the second measured information may be used for detecting whether an anomaly in the plurality of solder pastes printed on the first printed circuit board occurred after the second printed circuit boards are inspected. For example, the second measured information may be generated by combining sequentially the measured information about the solder pastes printed on the plurality of the second printed circuit boards in accordance with the inspection sequence of the plurality of second printed circuit boards. A detailed method of creating the second measured information will be described below.

In an embodiment, the processor 130 may detect whether an anomaly in at least one solder paste of the plurality of solder pastes printed on a first printed circuit board occurred by using the first measured information and the second measured information. For example, the processor 130 may determine the difference between the first measured information and the second measured information by comparing the first measured information and the second measured information with each other, and when the determined difference is outside a predetermined range, the processor 130 may detect that, in the plurality of solder pastes printed on the first printed circuit board, an anomaly in at least one solder paste outside the predetermined range occurred. Further, the processor 130 may determine the difference between the first measured information and the second measured information, and when the determined difference is inside the predetermined range, the processor 130 may detect that an anomaly in the plurality of solder pastes printed on the first printed circuit board has not occurred. However, these examples are provided just for explanation and not limited thereto, the processor 130 may detect whether an anomaly in at least one solder paste occurred by using the first measured information and the second measured information in various ways such as statistically analyzing the first measured information and the second measured information according to the inspection sequence of a plurality of printed circuit boards.

In an embodiment, the processor 130 may determine a change in the measured information about the solder pastes printed on the plurality of second printed circuit boards according to the inspection sequence of the second printed circuit boards on the basis of the second measured information. For example, the processor 130 may determine differences in the measured information about the solder pastes printed on the plurality of second printed circuit boards and determine how the differences change in accordance with the inspection sequence of the second printed circuit boards.

Further, the processor 130 may determine the fault types associated with the at least one solder paste in which the anomaly is detected of the at least one fault type of the screen printer 101 on the basis of the determined changes in the measured information about the solder pastes. For example, when an anomaly in at least one solder paste of the plurality of solder pastes is detected, the processor 130 may determine fault type associated with the at least one solder paste in which the anomaly is detected on the basis of the detected changes in the measured information about the solder pastes.

In an embodiment, when an anomaly in at least one solder paste of the plurality of solder pastes is detected, the processor 130 may generate at least one image indicating whether an anomaly associated with the plurality of solder pastes is detected. In order to detect the fault type, which are associated with the at least one solder paste in which the anomaly is detected, of the screen printer 101 using the machine-learning based model, the processor 130 may generate at least one image indicating whether an anomaly associated with the plurality of solder pastes is detected.

For example, at least one image indicating whether an anomaly associated with a plurality of solder pastes printed is detected may be at least one of an image indicating whether an anomaly associated with all of the plurality of solder pastes printed on a first printed circuit board is detected, an image indicating whether an excessive supply anomaly in a plurality of solder pastes printed on a first printed circuit board is detected, and an image indicating an insufficient supply anomaly associated with a plurality of solder pastes printed on a first printed circuit board is detected.

For example, the processor 130 may generate an image indicating whether an anomaly associated with all of a plurality of solder pastes printed on a first printed circuit board is detected, and may generate an image indicating whether an excessive supply anomaly in a plurality of solder pastes printed on a first printed circuit board is detected, and an image indicating an insufficient supply anomaly associated with a plurality of solder pastes printed on a first printed circuit board is detected. However, this example is provided just for explanation and the present invention is not limited thereto, and the processor 130 may generate images used for learning the machine-learning based model.

In an embodiment, the processor 130 may obtain at least one value indicating relevance between the at least one fault type of the screen printer 101 and at least one generated image, using the machine-learning based model stored in the memory 120. The processor 130 may determine the fault type associated with the at least one solder paste in which the anomaly is detected from at least one fault types based on the obtained at least one value. The processor 130 may output information about the determined fault type through the display 140 or another output device (not shown). Further, the processor 130 may transmit the information about the determined fault type to another electronic device through a communication circuit (not shown) included in the printed circuit board inspection apparatus 100.

For example, the processor 130 may determine the fault type corresponding to a value over a predetermined threshold of the obtained at least one value as the fault type associated with the at least one solder paste in which the anomaly is detected.

In an embodiment, the processor 130 may determine the fault type, which is associated with the at least one solder paste in which the anomaly is detected, of the screen printer 101 and then perform learning on the machine-learning based model through the at least one generated image. As described above, the processor 130 may more exactly determine the fault type, which is associated with the at least one solder paste in which the anomaly is detected, of the screen printer 101, by performing learning on the machine-learning based model every time printed circuit boards are inspected.

FIG. 2 is a flowchart of a method of determining a fault type associated with at least one solder paste in which an anomaly is detected according to various embodiments of the present disclosure.

Process steps, method steps, and algorithms are sequentially illustrated sequentially in the flowcharts of FIGS. 2, 3 and 5, but the processes, methods, and algorithms may be performed in any predetermined sequence as appropriate. In other words, the steps of processes, methods, and algorithms described in various embodiments of the present disclosure are not necessarily performed in the sequence described herein. Further, although some steps are described as being non-simultaneously performed, they may be simultaneously performed in another embodiment. Further, examples of processes shown in the drawings do not mean that the exemplary processes exclude other changes and modifications, do not mean that some of the exemplary processes or the steps of the processes are necessary in one of various embodiments of the present disclosure, and do not mean that the exemplary processes are preferable.

In step 210, the processor 130 of the printed circuit board inspection apparatus 100 may obtain an image of a first printed circuit board printed with a plurality of solder pastes through the image sensor 110. The processor 130 may further obtain measured information about the solder pastes using the obtained image. The measured information about the solder pastes may include at least one of the volume, area, height, shape, and position of the plurality of solder pastes.

In step S220, if an anomaly in at least one solder paste of the plurality of solder pastes printed on the first printed circuit board is detected by using an image of the first printed circuit board, the processor 130 may generate at least one image indicating whether an anomaly associated with a plurality of solder pastes printed on a first printed circuit board is detected, using the obtained image of the first printed circuit board. In order to determine a fault type, which are associated with the at least one solder paste in which the anomaly is detected, of the screen printer 101 using the machine-learning based model stored in the memory 120, the processor 130 may generate at least one image indicating whether an anomaly associated with the plurality of solder pastes printed on a first printed circuit board is detected.

In step S230, the processor 130 may obtain at least one value indicating relevance between at least one fault type of the screen printer 101 and the at least one generated image, using the machine-learning based model stored in the memory 120. For example, the machine-learning based model may extract characteristics of the at least one generated image and derive at least one value indicating relevance between the fault types of the screen printer 101 and the one or more generated images based on the extracted characteristics.

In step 240, the processor 130 may determine the fault types associated with the at least one solder paste in which the anomaly is detected from the at least one fault type of the screen printer 101 based on the obtained at least one value.

For example, the processor 130 may determine a fault type corresponding to value over a predetermined threshold of the obtained at least one value as the fault type associated with the at least one solder paste in which the anomaly is detected.

Alternatively, the processor 130 may detect a plurality of fault types corresponding to upper n values based on the magnitudes of the obtained values as fault types associated with the at least one solder paste in which the anomaly is detected. In this case, the number corresponding to n may depend on the situation.

FIG. 3 is a flowchart of a method of detecting an anomaly in at least one solder paste printed on a printed circuit board, according to various embodiments of the present disclosure.

In step 310, the processor 130 of the printed circuit board inspection apparatus 100 may obtain first measured information about a plurality of solder pastes printed on the first printed circuit board using an image of the first printed circuit board obtained by the image sensor 110. For example, the processor 130 may measure information about at least one of the volume, area, height, shape, and position of the plurality of solder pastes from an image and generate first measured information on the basis of the measured information.

In step 320, the processor 130 may retrieve second measured information in the memory (120). Alternatively, the processor may receive the second measured information form an external server. The second measured information may be measured information about a plurality of solder pastes printed on a plurality of second printed circuit boards that have been inspected by the printed circuit board inspection apparatus 100 before the first printed circuit board is inspected. For example, the processor 130 may measure information about at least one of the volume, area, height, shape, and position of the plurality of solder pastes printed on the plurality of second printed circuit boards from images of the second printed circuit boards in the process of inspecting the second printed circuit boards, and generate the second measured information on the basis of the measured information. The processor 130 may store the generated second measured information in the memory 120 or store the generated second measurement information in the external server. Further, the processor 130 may update the second measured information by adding the first measured information to the second measured information after the first printed circuit board is inspected.

In step 330, the processor 130 may determine whether the anomaly in at least one solder paste of the plurality of solder pastes occurred by using the first measured information and the second measured information. For example, the processor 130 may determine the difference between the first measured information and the second measured information by comparing the first measured information and the second measured information each other, and when the determined difference is outside a predetermined range, the processor 130 may detect that, in the plurality of solder pastes printed on the first printed circuit board, an anomaly in at least one solder paste outside the predetermined range occurred. Further, the processor 130 may determine the difference between the first measured information and the second measured information, and when the determined difference is inside the predetermined range, the processor 130 may detect that an anomaly in the plurality of solder pastes printed on the first printed circuit board has not occurred.

Figure 4A:
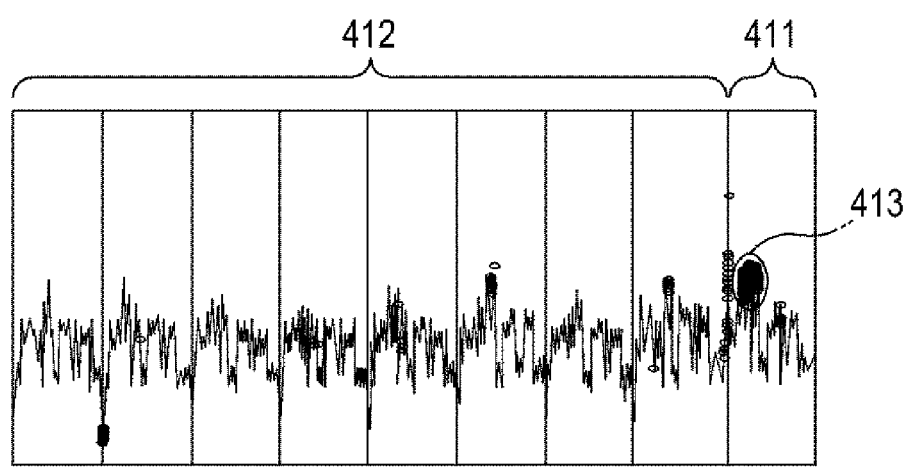
FIGS. 4A to 4C indicate graphs indicating first measured information and second measured information, according to various embodiments of the present disclosure.
Figure 4B:
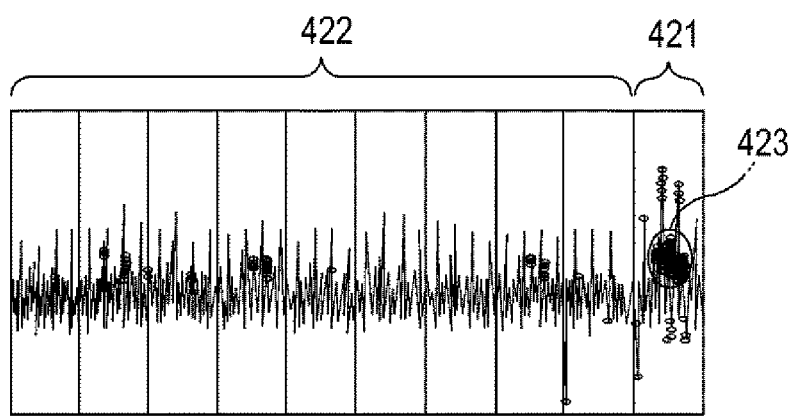
Figure 4C:
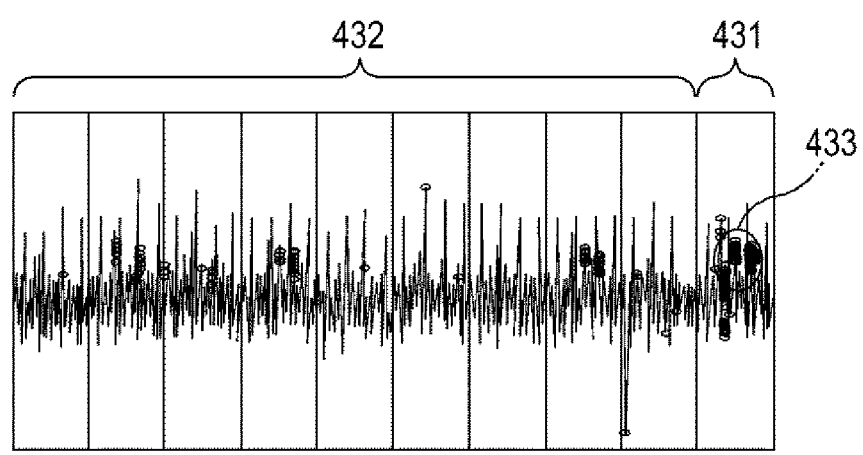

FIGS. 4A to 4C indicate graphs indicating first measured information and second measured information and a printed circuit board printed with a solder paste having a problem, according to various embodiments of the present disclosure.

Referring to FIGS. 4A to 4C, second measured information 412, 422, and 432 may be generated by combining sequentially the measured information about a plurality of solder pastes respectively printed on a plurality of second printed circuit boards according to an inspection sequence by the printed circuit board inspection apparatus 100. Here, the measurement information may include measured information for each of a plurality of solder pastes printed on each of the plurality second printed circuit boards or the first printed circuit board.

For example, first measured information 411, 421, and 431 and second measured information 412, 422, and 432 may include measured information about a plurality of solder pastes printed on one printed circuit board arranged in accordance with area ratios of pads on which the solder pastes are printed. However, this is provided juts as an example and the present disclosure is not limited thereto, and the measured information about a plurality of solder pastes included in the first measured information 411, 421, and 431 and the second measured information 412, 422, and 432 may be arranged in accordance with the ID information, the aspect ratios of the pads on which the solder pastes are printed or an inspection order of each of the plurality of solder pastes or may be randomly distributed without a specific reference.

In an embodiment, the processor 130 of the printed circuit board inspection apparatus 100 may compare the first measured information 411, 421, and 431 and the second measured information 412, 422, and 432 with each other. The processor 130 may determine differences between the first measured information 411, 421, and 431 and the second measured information 412, 422, and 432 by comparing the first measured information 411, 421, and 431 and the second measured information 412, 422, and 432 with each other. Further, the processor 130 may determine parts 413, 423, and 433 of the determined differences that are outside a predetermined range. The processor 130 may determine that an anomaly in at least one solder paste corresponding to the determined parts 413, 423, and 433 outside the predetermined range occurred.

In an embodiment, the processor 130 may update the second measured information 412, 422, and 432 by adding the first measured information 411, 421, and 431 to the second measured information 412, 422, and 432, after inspection on the first printed circuit board is finished. For example, the processor 130 may update the second measured information 412, 422, and 432 only when an anomaly in the solder pastes printed on the first circuit board does not occurred. Alternatively, the processor 130 may update the second measured information 412, 422, and 432 even if an anomaly at least one the solder paste printed on the first circuit board occurred.

FIG. 5 is a flowchart of a method of determining a fault type of a screen printer that are associated with at least one solder paste in which an anomaly is detected, according to various embodiments of the present disclosure In step 510, the processor 130 of the printed circuit board inspection apparatus 100 may determine a change in the measured information about the solder pastes printed on the second printed circuit boards according to the inspection sequence of the second printed circuit boards on the basis of the second measured information. For example, the processor 130 may determine how the measured information about a plurality of solder pastes printed on a plurality of second printed circuit boards changes in accordance with the inspection sequence of the second printed circuit boards.

In step 520, the processor 130 may determine fault type associated with the at least one solder paste in which an anomaly is detected of the at least one fault type of the screen printer 101 based on the determined changes in the measured information about the solder paste. For example, if an anomaly in at least one solder paste of the plurality of solder pastes is detected, the processor 130 may determine fault type associated with the at least one solder paste in which the anomaly is detected on the basis of the determined changes in the measured information about the solder pastes, before using the machine-learning based model. Alternatively, the processor 130 may simultaneously perform determination of the fault type through the machine-learning based model and determination of fault types on the basis of the changes in the measured information. In this case, the processor 130 may finally determine the fault types associated with the at least one solder paste in which the anomaly is detected, using the results of determination of the fault type through the machine-learning based model and determination of fault types on the basis of the changes in the measured information.

In step 530, the processor 130 may output information about the determined fault type through the display 140 or another output device. Further, the processor 130 may transmit information about the determined fault type to another electronic device.

Figure 6:
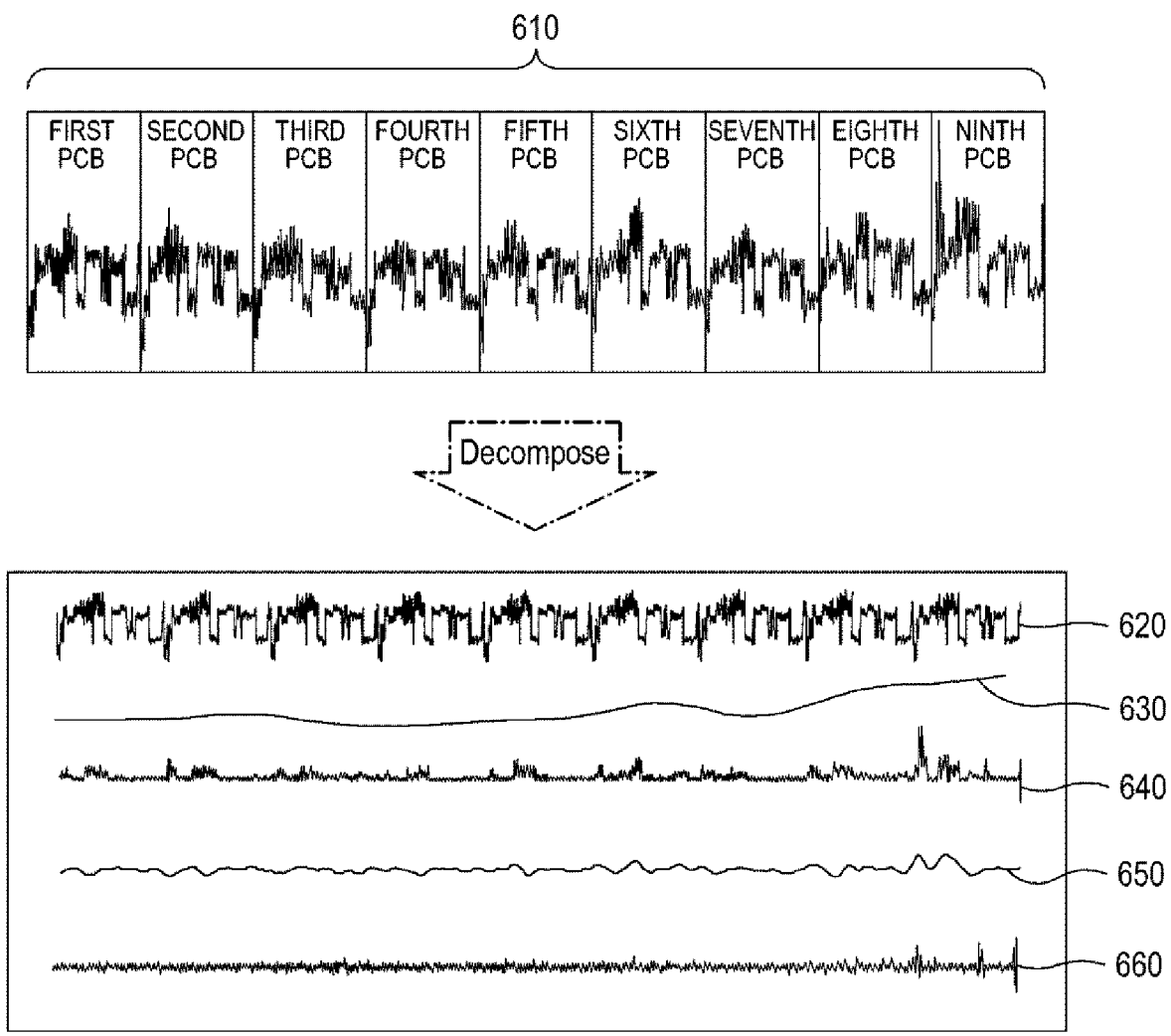
FIG. 6 is a graph indicating second measured information and a plurality of information decomposed from the second measured information, according to various embodiments of the present disclosure.

FIG. 6 is a graph indicating second measured information and a plurality of information decomposed from the second measured information, according to various embodiments of the present disclosure.

In an embodiment, second measured information may be generated by combining sequentially measured information about a plurality of solder pastes printed on a plurality of second printed circuit boards in accordance with the inspection sequence by the printed circuit board inspection apparatus 100.

As in FIG. 6, when a first PCB to a ninth PCB are inspected sequentially according to the inspection sequence by the printed circuit board inspection apparatus 100, second measured information 610 may be generated by combining sequentially measured information about a plurality of solder pastes printed on the first to ninth PCBs according to the inspection sequence of the first to ninth PCBs. The second measured information 610 may be used for detecting whether an anomaly in a plurality of solder pastes printed on a printed circuit board, that is carried and inspected later by the printed circuit board inspection apparatus 100, occurred.

Further, the measured information about the solder pastes printed on the first to ninth PCBs may be arranged on the basis of information about a plurality of pads on which the solder paste is printed. The measured information about the solder pastes printed on the first to ninth PCBs may be combined sequentially according to the inspection sequence of the first to ninth PCBs. For example, measured information about the solder pastes printed on the first to ninth PCBs may be arranged on the basis of the characteristics of the pads (for example, the area ratio, aspect ratio, position cluster group ID, or pad ID).

The characteristics of the pads on the printed circuit boards may be different, so the second measured information 610 may be decomposed into, as in the following Equation 1, period information 620, tendency information 630, conditional distribution information 640, average movement tendency information 650, and error information 660.

$$Yt = St + Tt + ht + \mu t + Et \qquad \text{[Equation 1]}$$

where Yt is the second measured information 610, St is the period information 620, Tt is the tendency information 630, ht is the conditional distribution information 640, μt is the average movement tendency information 650, and Et is the error information 660. When the second measured information 610 is generated in this way, it is possible to generate the period information 620, tendency information 630, conditional distribution information 640, average movement tendency information 650, and error information 660 by decomposing the second measured information 610.

For example, the period information 620 may be the same in the first to ninth PCBs and the tendency information 630 may indicate the tendency of the measured information about the solder pastes printed on the first to ninth PCBs. The conditional distribution information 640 may be information indicating fluctuation according to the different characteristics of the pads and the average movement tendency information 650 may be information indicating the tendency of the measured information about solder pastes having different average values due to the different characteristics of the pads. The error information 660 may be noise except for the period information 620, tendency information 630, conditional distribution information 640, and average movement tendency information 650 in the second measured information 610. As described above, by decomposing the second measured information 610 in consideration of the different characteristics of the pads on the printed circuit boards, it is possible to more exactly analyze the second measured information 610 generated by combining sequentially the measured information about the solder pastes printed on the first to ninth PCBs according to the inspection sequence of the first to ninth PCBs. Further, it is possible to determine a fault in the screen printer 101 by determining changes in the measured information about the solder pastes printed on the first to ninth PCBs according to the analysis result.

In an embodiment, the first measured information about the solder pastes printed on the first printed circuit board may also be decomposed into period information, tendency information, conditional distribution information, average movement tendency information, and error information in accordance with the characteristics of a plurality of pads on the first printed circuit board. The processor 130 of the printed circuit board inspection apparatus 100 may compare the period information, tendency information, conditional distribution information, average movement tendency information, and error information decomposed from the first measured information with the period information 620, tendency information 630, conditional distribution information 640, average movement tendency information 650, and error information 660 decomposed from the second measured information 610. The processor 130 may detect whether the anomaly in at least one solder paste of the plurality of solder pastes occurred using the comparison result.

FIGS. 7A and 7B illustrate images indicating whether an anomaly in a plurality of solder pastes printed on a printed circuit board is detected according to various embodiments of the present disclosure.

In an embodiment, the processor 130 of the printed circuit board inspection apparatus 100 may generate at least one image 720, 730, and 740 used for learning of the machine-learning based model from an image 710 of a first printed circuit board. The processor 130 may acquire at least one value indicating the relevance between the at least one fault type of the screen printer 101 and the generated at least one image, using the learned machine-learning based model.

For example, when the machine-learning based model is learned through the image 720 indicating whether an anomaly associated with all of a plurality of solder pastes printed on a first printed circuit board is detected, the processor 130, as shown in FIG. 7A, may generate the image 720 indicating whether an anomaly associated with all of a plurality of solder pastes printed on a first printed circuit board is detected. For example, at least one solder paste of which an anomaly is not detected may be marked as black and at least one solder paste of which the anomaly is detected may be marked as white. In addition, whether an anomaly in a plurality of solder pastes may be indicated by a value of 0 or 1. For example, a pixel value corresponding to at least one solder paste of which an anomaly is not detected may be set to 0 and a pixel value corresponding to at least one solder paste of which the anomaly is detected may be set to 1.

Alternatively, the machine-learning based model is learned through the image 730 indicating whether an excessive supply anomaly in a plurality of solder pastes printed on a first printed circuit board is detected and the image 740 indicating an insufficient supply anomaly in a plurality of solder pastes printed on a first printed circuit board is detected, the processor 130, as shown in FIG. 7B, may generate the image 730 and the image 740. In the generated image 730, whether an excessive supply anomaly in a plurality of solder pastes printed on a first printed circuit board is detected is displayed. Further, in the generated image 740, whether an insufficient supply anomaly in a plurality of solder pastes printed on a first printed circuit board is detected is displayed.

Further, when the machine-learning based model is learned through one or more other images different from the images described above, the processor 130 may generate one or more other images different from the images described above.

Figure 8:
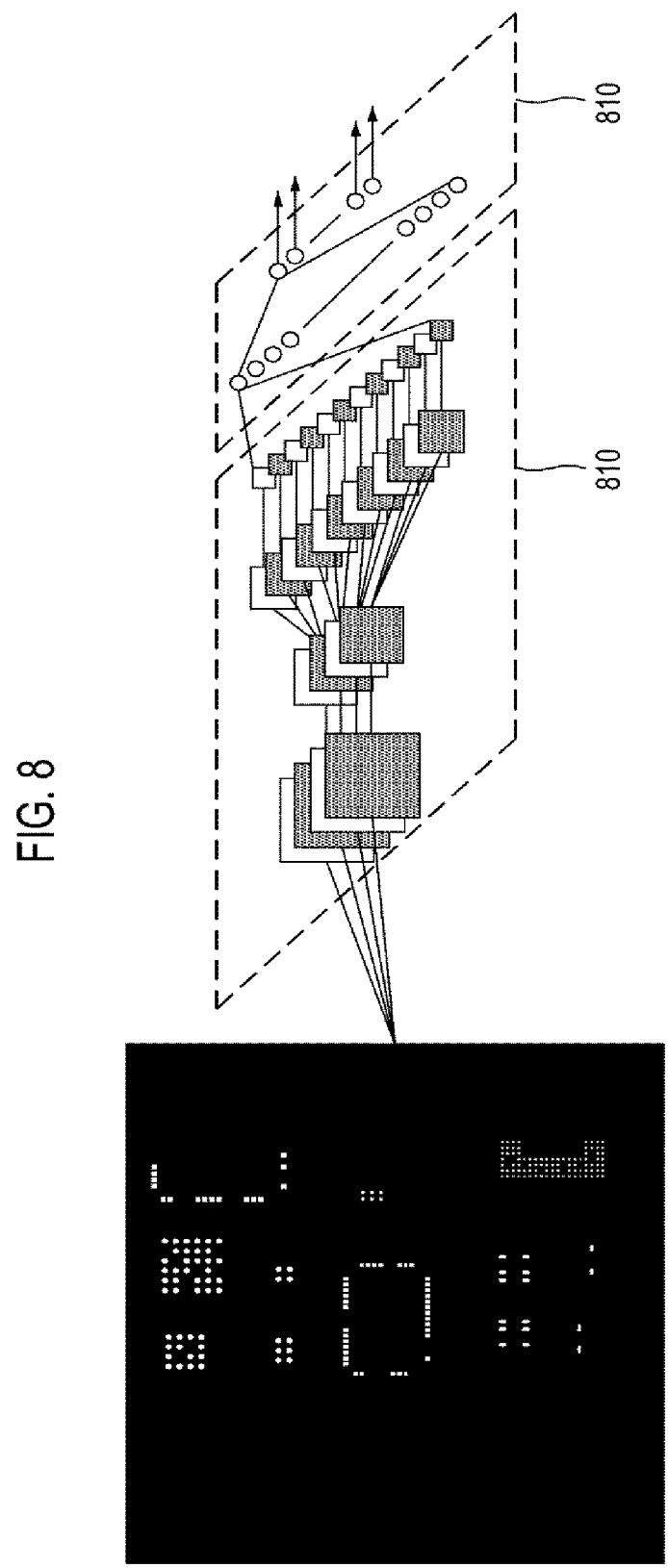
FIG. 8 is a conceptual diagram indicating a machine-learning based model according to various embodiments of the present disclosure.

FIG. 8 is a conceptual diagram indicating a machine-learning based model according to various embodiments of the present disclosure.

In an embodiment, the processor 130 of the printed circuit board inspection apparatus 100 may perform learning on the machine-learning based model through a plurality of images indicating whether an anomaly in a plurality of solder pastes printed on a printed circuit board is detected, classified in accordance with at least one fault type of the screen printer 101. A CNN model that is one of the machine-learning based models is exemplified in the following description for the convenience of description, but the present disclosure is not limited thereto and various machine-learning based models may be used.

In an embodiment, as images that are used to perform learning on the CNN model, at least one of an image indicating whether an anomaly associated with all of a plurality of solder pastes printed on a first printed circuit board is detected, an images indicating whether an excessive supply anomaly in a plurality of solder pastes printed on a first printed circuit board is detected, and an image indicating an insufficient supply anomaly in a plurality of solder pastes printed on a first printed circuit board is detected may be used.

For example, characteristic extraction layer 810 of CNN including one or more convolution layers and one or more pooling layers may extract the characteristics of the image indicating whether an anomaly in a plurality of solder pastes printed on a first printed circuit board is detected. The characteristic extraction layer 810 may use a 3×3 or 5×5 filter to extract the characteristics of an image. The coefficients of the 3×3 or 5×5 filter may be determined in the process of performing learning on the CNN through a plurality of images indicating whether an anomaly in a plurality of solder pastes printed on a first printed circuit board is detected, classified in accordance with at least on of fault type of the screen printer 101.

Further, a classifier 820 that is a fully connected layer of the CNN may classify images indicating whether an anomaly in a plurality of solder pastes printed on a first printed circuit board is detected, using the characteristics extracted by the characteristic extraction layer 810. The classification result acquired by the classifier 820 may include values indicating the relevance between an image indicating whether an anomaly in a plurality of solder pastes printed on a first printed circuit board is detected and the at least one fault type.

Although the method was described through specific embodiments, the method may be implemented by computer-readable codes on a computer-readable recording medium. The computer-readable recording medium includes all kinds of recording devices that store data that may be read by a computer system. The computer-readable recording medium may include a ROM, a RAM, a CD-ROM, an optical data storage etc. Further, the computer-readable recording mediums may be distributed to computer systems that are connected through a network and may store and execute codes that may be divisionally read by computers. Further, functional programs, codes, and code segments for implementing the embodiments may be easily inferred by programmers in the art.

Although the spirit of the present disclosure was described with reference to the embodiments and the examples shown in the figures, it should be understood that the present disclosure may be replaced, changed, and modified by those skilled in the art in various ways without departing from the spirit and scope of the present disclosure. Further, those replacements, changes, and modifications should be considered as being included in the claims.

What is claimed is:

1. A printed circuit board inspection apparatus comprising:
   a memory configured to store a machine-learning based model that derives at least one value indicating relevance between at least one fault type of a screen printer and an image indicating whether an anomaly associated with a plurality of solder pastes printed on a printed circuit board is detected; and
   a processor electrically connected with the memory, wherein the processor is configured to:
   generate at least one image indicating whether an anomaly associated with a plurality of solder pastes printed on a first printed circuit board is detected, if the anomaly in at least one solder paste of the plurality of solder pastes is detected by using an image of the first printed circuit board,
   obtain at least one value indicating relevance between at least one fault type and the generated at least one image, using the machine-learning based model, and
   determine a fault type associated with the at least one solder paste in which the anomaly is detected from the at least one fault type, based on the obtained at least one value,
   wherein the at least one solder paste in which the anomaly is detected and at least one solder paste in which the anomaly is not detected among the plurality of solder pastes printed on the first printed circuit board are distinguished from each other in the at least one image generated by the processor.

2. The apparatus of claim 1, wherein the processor detects whether the anomaly in the at least one solder paste of the plurality of solder pastes occurred using first measured information about the plurality of solder pastes obtained from the image of the first printed circuit board.

3. The apparatus of claim 2, wherein the first measured information includes at least one of a volume, an area, a height, a shape, or a position of a solder paste.

4. The apparatus of claim 3, wherein the memory further stores second measured information about a plurality of solder pastes respectively printed on a plurality of second printed circuit boards that have been inspected by the apparatus before the first printed circuit board is inspected, and
   wherein the processor detects whether the anomaly in the at least one solder paste of the plurality of solder pastes occurred by using the first measured information and second measured information.

5. The apparatus of claim 4, wherein the second measured information is generated by combining sequentially measured information about the plurality of solder pastes respectively printed on the plurality of second printed circuit boards in accordance with an inspection sequence of the plurality of second printed circuit boards.

6. The apparatus of claim 5, wherein the processor determines changes in the measured information about the plurality of solder pastes respectively printed on the plurality of second printed circuit boards according to the inspection sequence of the plurality of second printed circuit boards on the basis of the second measured information, and determines the fault type associated with the at least one solder paste in which the anomaly is detected from the at least one fault type based on the determined changes in the measured information.

7. The apparatus of claim 1, wherein the at least one fault type includes a fault of a squeegee blade, a fault in fixing of the squeegee blade, a fault of a support part, a fault of a table, a fault due to poor setting of a grid lock, a fault due to negligence and poor kneading of a solder paste, a fault due to a deficit of a solder paste, and a fault due to poor contact of a stencil.

8. The apparatus of claim 1, wherein the machine-learning based model is a CNN (Convolution Neural Network) model.

9. The apparatus of claim 1, wherein the processor performs learning on the machine-learning based model through a plurality of images indicating whether an anomaly in a plurality of solder pastes printed on a printed circuit board is detected, classified in accordance with at least one fault type.

10. The apparatus of claim 9, wherein the processor performs learning on the machine-learning based model through the generated at least one image, after the fault type associated with the at least one solder paste in which the anomaly is detected is determined.

11. The apparatus of claim 1, wherein the processor determines the fault type corresponding to value over a predetermined threshold of the obtained at least one value as the fault type associated with the at least one solder paste in which the anomaly is detected.

12. A non-transitory computer-readable recording medium having a program to be executed by a computer, wherein the program includes executable instructions that instruct a processor, when the program is executed by the processor, to perform:

generating at least one image indicating whether an anomaly associated with a plurality of solder pastes printed on a first printed circuit board is detected, if an anomaly in at least one solder paste of the plurality of solder pastes is detected by using an image of the first printed circuit board;

obtaining at least one value indicating relevance between at least one fault type and the at least one image using a machine-learning based model that derives at least one value indicating relevance between at least one fault type of a screen printer and an image indicating whether an anomaly in the plurality of solder pastes printed on a printed circuit board is detected; and determining a fault type associated with the at least one solder paste in which the anomaly is detected from the at least one fault type, based on the obtained at least one value, wherein the at least one solder paste in which the anomaly is detected and at least one solder paste in which the anomaly is not detected among the plurality of solder pastes printed on the first printed circuit board are distinguished from each other in the at least one image generated by the processor.

13. The computer-readable recording medium of claim 12, wherein the executable instructions further instruct the processor to perform detecting whether the anomaly in the at least one solder paste of the plurality of solder pastes occurred, using first measured information about the plurality of solder pastes obtained from the image of the first printed circuit board.

14. The computer-readable recording medium of claim 13, wherein the first measured information includes at least one of a volume, an area, a height, a shape, or a position of a solder paste.

15. The computer-readable recording medium of claim 13, wherein the detecting whether the anomaly in the at least one solder paste of the plurality of solder pastes occurred includes detecting whether the anomaly in the at least one solder paste of the plurality of solder pastes occurred by using the first measured information and second measured information, wherein the second measured information is generated by combining sequentially measured information about a plurality of solder pastes respectively printed on a plurality of second printed circuit board in accordance with inspection sequence of a plurality of second printed circuit boards that have been inspected by a printed circuit board inspection apparatus before the first printed circuit board is inspected.

16. The computer-readable recording medium of claim 12, wherein the machine-learning based model is a CNN (Convolution Neural Network) model.

17. The computer-readable recording medium of claim 12, wherein the executable instructions further instruct the processor to perform learning on the machine-learning based model through a plurality of images indicating whether an anomaly associated with a plurality of solder pastes printed on a printed circuit board is detected, classified in accordance with at least one fault type.

18. The computer-readable recording medium of claim 12, wherein the determining the fault type includes determining the fault type corresponding to value over a predetermined threshold of the obtained at least one value as the fault type associated with the at least one solder paste in which the anomaly is detected.

19. A method for determining a fault type of a screen printer by a printed circuit board inspection apparatus, the method comprising:

generating at least one image indicating whether an anomaly associated with a plurality of solder pastes printed on a first printed circuit board is detected, if an anomaly in at least one solder paste of the plurality of solder pastes is detected by using an image of the first printed circuit board;

obtaining at least one value indicating relevance between at least one fault type and the generated at least one image, using a machine-learning based model that derives at least one value indicating relevance between at least one fault type of the screen printer and an image indicating whether an anomaly associated with the plurality of solder pastes printed on a printed circuit board is detected; and determining a fault type associated with the at least one solder paste in which the anomaly is detected from the at least one fault type, based on the obtained at least one value, wherein the at least one solder paste in which the anomaly is detected and at least one solder paste in which the anomaly is not detected among the plurality of solder pastes printed on the first printed circuit board are distinguished from each other in the at least one image generated by the processor.

* * * * *